United States Patent [19]
Kwan et al.

[11] Patent Number: 4,730,170
[45] Date of Patent: Mar. 8, 1988

[54] VIRTUAL CATHODE MICROWAVE GENERATOR HAVING ANNULAR ANODE SLIT

[75] Inventors: Thomas J. T. Kwan; Charles M. Snell, both of Los Alamos, N. Mex.

[73] Assignee: The United States of America as represented by the Department of Energy, Washington, D.C.

[21] Appl. No.: 32,262

[22] Filed: Mar. 31, 1987

[51] Int. Cl.[4] .......................... H03B 9/01; H01J 25/74
[52] U.S. Cl. ...................................... 331/79; 315/5.31; 315/5.35; 315/39; 331/86
[58] Field of Search .................... 315/5, 5.31, 5.35, 39; 331/79, 86

[56] References Cited

U.S. PATENT DOCUMENTS 4,345,220 8/1982 Sullivan ................................ 331/79
4,553,068 11/1985 Brandt ................................ 315/5 X

OTHER PUBLICATIONS

Donald J. Sullivan, "High Power Microwave Generation From a Virtual Cathode Oscillator (Vircator)," IEEE Trans. Nucl. Sci., vol. NS-30, No. 4, 3426-3428 (Aug. 1983).

Thomas J. T. Kwan, "High-Power Coherent Microwave Generation from Oscillating Virtual Cathodes," Phys. Fluids 27 (1), 228-232 (Jan. 1984).

Thomas J. T. Kwan et al., "Formation of Virtual Cathodes and Microwave Generation in Relativistic Electron Beams," Phys. Fluids 27 (7), 1570-1572 (Jul. 1984).

*Primary Examiner*—Siegfried H. Grimm
*Attorney, Agent, or Firm*—Ray G. Wilson; Paul D. Gaetjens; Judson R. Hightower

[57] ABSTRACT

A microwave generator is provided for generating microwaves substantially from virtual cathode oscillation. Electrons are emitted from a cathode and accelerated to an anode which is spaced apart from the cathode. The anode has an annular slit therethrough effective to form the virtual cathode. The anode is at least one range thickness relative to electrons reflecting from the virtual cathode. A magnet is provided to produce an optimum magnetic field having the field strength effective to form an annular beam from the emitted electrons in substantial alignment with the annular anode slit. The magnetic field, however, does permit the reflected electrons to axially diverge from the annular beam. The reflected electrons are absorbed by the anode in returning to the real cathode, such that substantially no reflexing electrons occur. The resulting microwaves are produced with a single dominant mode and are substantially monochromatic relative to conventional virtual cathode microwave generators.

5 Claims, 8 Drawing Figures

VIRTUAL CATHODE MICROWAVE GENERATOR HAVING ANNULAR ANODE SLIT

BACKGROUND OF THE INVENTION

This invention relates to generating coherent electromagnetic radiation from charged particle beams and, more particularly, to generating microwaves from relativistic electron beams which form an oscillating virtual cathode. This invention is the result of a contract with the Department of Energy (Contract No. W-7405-ENG-36).

Relativistic electron beam devices can form oscillating virtual cathodes, a nonlinear state arising when the electron beam current exceeds the space-charge limiting current as defined by the beam energy and system geometry. Oscillation of the virtual cathode generates microwaves in a waveguide. U.S. Pat. No. 4,345,220 to Sullivan teaches various theoretical aspects concerning the formation of a virtual cathode and is incorporated herein by reference. Experiments in conventional configurations indicate that this class of microwave generator produces microwaves at multiple frequencies and modes, operates at relatively low efficiencies, and the output usually shows bursts or erratic variation with time.

The complex behavior of virtual cathode devices may be attributed to microwaves generated by two distinct processes arising from the virtual cathode. As noted above, the oscillating virtual cathode itself generates microwaves since the space-charge formed at the virtual cathode moves with time. The space-charge, however, also generates repulsive forces for electrons at the virtual cathode, reflecting some electrons back to the real cathode. Electrons can become trapped in this manner, reflexing between the real and the virtual cathodes. The reflexing electrons also generate microwaves which can interfere destructively with microwaves arising from the oscillating virtual cathode.

It has been suggested that microwave generation from a virtual cathode generator might be coherent and efficient if electron reflexing into the diode region (i.e., the region between the cathode and anode) is prevented. See Donald J. Sullivan, "High Power Microwave Generation From A Virtual Cathode Oscillator (Vircator)," IEEE Transactions on Nuclear Science, Vol. NS-30 No. 4, 3426-3428 (August 1983), incorporated herein by reference. Sullivan, however, proposes a foilless diode with a strong axial magnetic field where an ungrounded collimator might be used to help prevent reflexing of electrons back to the cathode. No experimental or simulated parameters are provided, however, to indicate operability of such a device and, indeed, foilless diodes are known to generate an unstable virtual cathode with attendant random microwave generation and inefficiency.

An anode foil with narrow slits was suggested by Thomas J. T. Kwan, "High-Power Coherent Microwave Generation From Oscillating Virtual Cathodes," Phys. Fluids, 27 (1), 228-232 (January 1984), for absorbing a majority of the reflected electrons. It was suggested that suppression of the reflexing electrons could lead to more efficient microwave generation. There are no simulation parameters or results associated with this suggested configuration. Accordingly, it would be desirable to provide an efficient and coherent generator of microwaves using oscillating virtual cathodes. Such a device is obtained in accordance with the present invention and microwave production is confined to an oscillating virtual cathode for efficient and coherent generation.

Thus, it is an object of the present invention to develop an efficient microwave generator using an oscillating virtual cathode.

Yet another object of the present invention is to generate microwaves from a virtual cathode source with a narrow bandwidth spectrum and with most of the energy radiated in a few modes.

One other object of the present invention is to develop an operable microwave generator eliminating reflexing electrons as a microwave source.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the apparatus of this invention may comprise a microwave generator using an oscillating virtual cathode. Electrons are emitted from a cathode and accelerated to an anode spaced apart from the cathode. The anode has an annular slit therethrough effective for forming the virtual cathode. The anode is at least one range thickness relative to electrons reflecting from the virtual cathode. A magnet is provided to produce an optimum magnetic field having a field strength effective to form an annular beam from the emitted electrons in substantial alignment with the annular anode slit, while enabling electrons reflecting from the virtual cathode to axially diverge from the annular beam. The reflecting electrons are absorbed by the anode in returning toward the real cathode, such that substantially no reflexing electrons occur.

In another characterization of the present invention, a method for generating coherent microwaves from an oscillating virtual cathode is provided. A cold cathode generates a relativistic electron beam which is effective to form a virtual cathode. The relativistic electron beam is confined to an annular beam path by a magnetic field and accelerated toward an anode having a predetermined thickness and defining a circumferential slit for passage of the annular beam therethrough to the virtual cathode. The space charge defining the virtual cathode develops repulsive forces effective to enable reflecting electrons to diverge from the axial magnetic field. The divergent electrons that return toward the cathode are then absorbed in the anode.

BRIEF DESCRIPTION OF THE DRAWINGS

The accompanying drawings, which are incorporated in and form a part of the specification, illustrate the embodiment of the present invention and, together with the description, serve to explain the principles of the invention. In the drawings.

DETAILED DESCRIPTION OF THE PREFERRED EMBODIMENT

Figure 1:
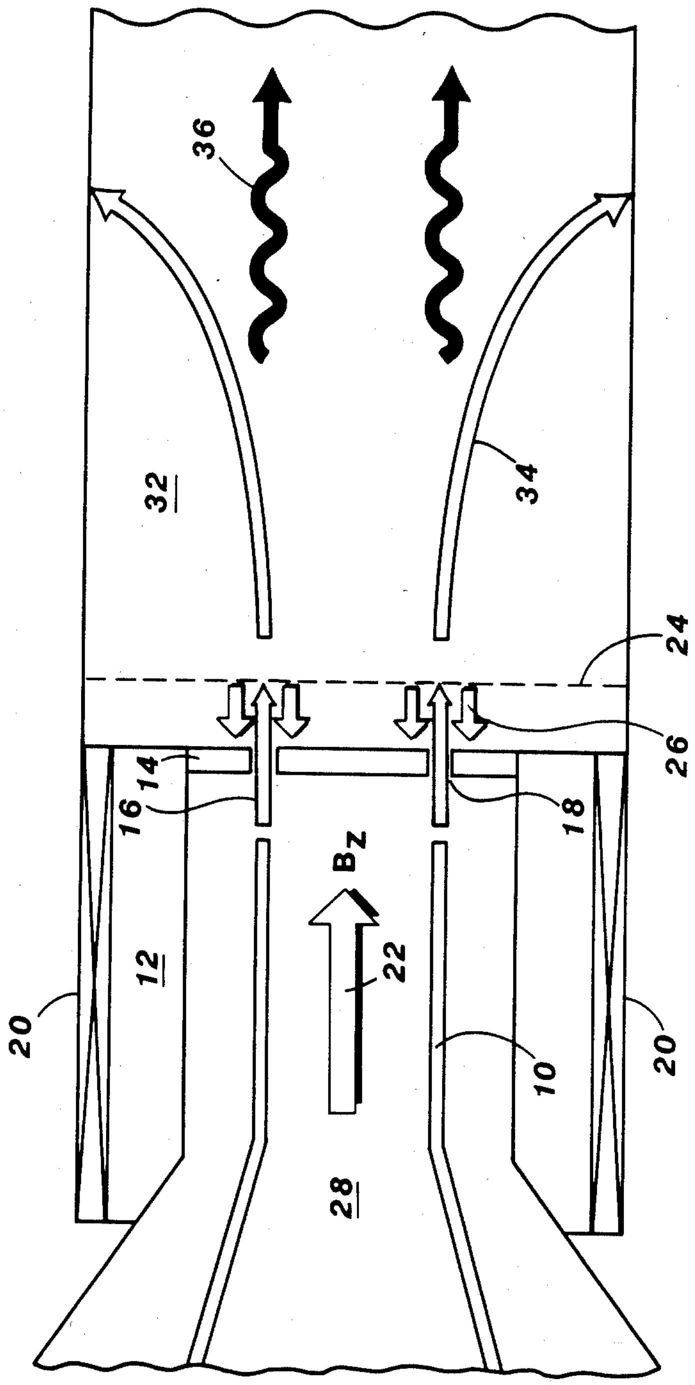
FIG. 1 is a schematic view of a microwave generator according to the present invention.

Referring now to FIG. 1 there is shown a schematic representation of a microwave generator according to one embodiment of the present invention. Annular cathode 10 is provided within anode 12 in a diode configuration with thick anode portion 14. A potential gradient is established between cathode 10 and anodes 12, 14 to cause electron field emission and acceleration toward thick anode 14..

In conventional virtual cathode microwave generators, anode 14 is a thin foil, substantially transparent to electrons, which establishes a defined potential barrier spaced from cathode 10. With a relativistic electron beam having a beam current which exceeds the space-charge limiting current, a virtual cathode is formed at a location downstream from the anode foil where the kinetic energy of the electrons accelerating through the anode is changed to potential energy. The space charge developed at this location serves to repulse entering electrons.

In accordance with the present invention, it was recognized that the transverse energy of the reflected electrons is greater than the transverse energy of the electrons that are field emitted by annular cathode 10. Accordingly, a magnetic field 22 can be selected which is effective to confine emitted electrons 16 to an annular beam path with the beam moving toward virtual cathode location 24 while permitting energetic reflected electrons 26 to diverge from the incoming annular beam path 16. The electric fields of the virtual cathode at location 24 and the generated microwaves impart energy to reflected electrons 26 which is transverse to magnetic field 22. Then, if magnetic field 22 is of limited strength, the radial forces are not balanced and the reflected beam radius can increase and reflected electrons 26 are not aligned with circumferential slit 18. Electrons 34 may be transmitted through virtual cathode space 24 into waveguide 32 and be impacted against the walls of waveguide 32.

Anode 14 can now be selected to have a thickness which is effective to absorb the diverging reflected electrons to prevent reflected electrons 26 from returning to diode region 28 and establishing a reflexing electron current. Thick anode 14 is provided with a circumferential slit 18 having a radius defined by annular electron beam 16 and magnetic field $B_z$ 22 to permit electron beam 16 to pass through anode 14 and establish virtual cathode 24. Thus, by functionally relating the magnetic field strength 22 produced by annular magnet 20 with the slit radius and width, microwave production efficiency from the virtual cathode can be maximized.

A "thick anode" is defined herein as an anode with a thickness of at least one electron range. An electron range is that thickness of material which will absorb all incoming electrons and that thickness is a function of electron energy and the absorption coefficient of the material. A conductive material having a high Z-number is preferably selected, e.g., titanium, tungsten, etc. Slit 18 is preferably covered by a thin foil of low-Z material, e.g., beryllium, to avoid electrical stress concentrated at edges and corners of slit 18.

Figure 2:
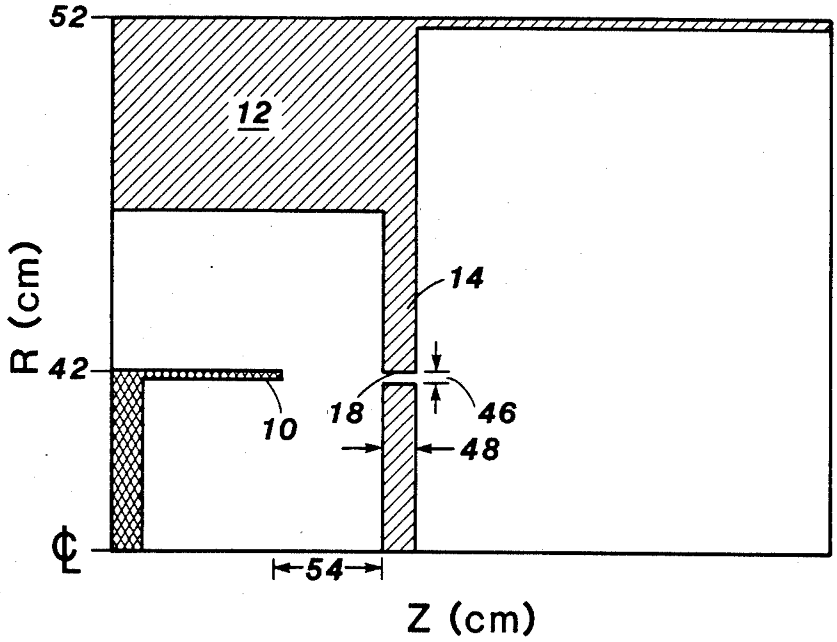
FIG. 2 depicts a simulation/experimental model for a microwave generator depicted in FIG. 1.

Referring now to FIG. 2 there is shown a schematic model representation for a virtual cathode microwave generator according to the present invention. The model depicted in FIG. 2 is rotated about the center line axis of symmetry to form a microwave generator according to the present invention. Thus, the model defines annular cathode 10 having a radius 42 with anode 12 and thick anode 14. Waveguide radius 52 is defined for the model. This anode 14 has thickness 48 and defines slit 18 with slit width 46. Anode 14 is spaced from cathode 10 by cathode-anode gap 54.

The performance of the microwave generator modeled in FIG. 2 has been determined by both computer simulations and by experiments. The Table depicts the geometries for both the simulations and the experiments.

Figure 3:
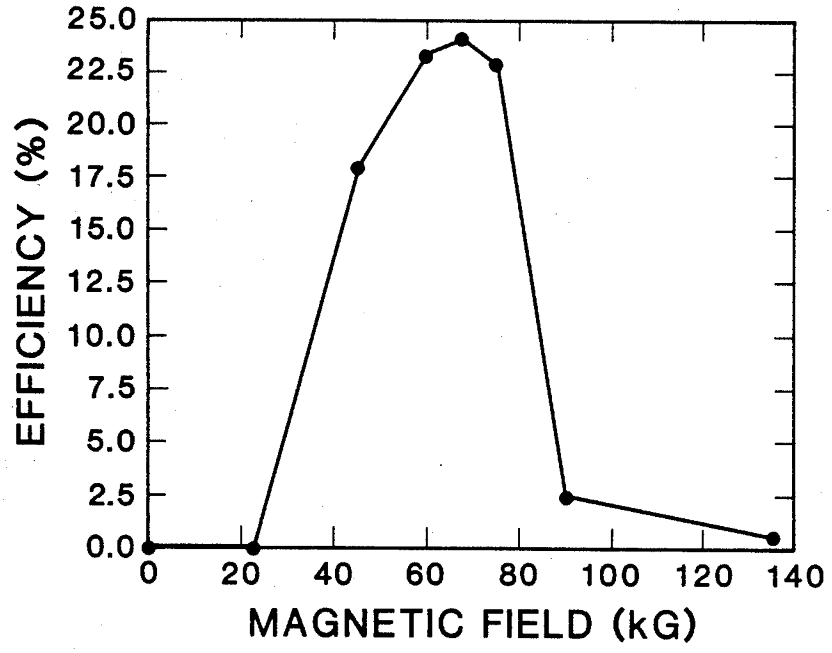
FIG. 3 is a graph of the simulated effect of an axial magnetic field on the efficiency performance of the generator depicted in FIG. 2.

FIG. 3 is a graph showing microwave generating efficiency as a function of applied magnetic field 22 (FIG. 1) with the simulated geometry set out in the Table. In accordance with the present invention, an optimum value range for the magnetic field strength is clearly defined. In the example, the electron beam is not adequately guided through the slit with a magnetic field strength less than about 22 kG. When the magnetic field strength was increased beyond about 80 kG, the efficiency dropped off rapidly because the magnetic field strength was sufficiently great that the reflected electrons had insufficient energy to diverge from the magnetic field lines. Thus, the high magnetic fields simply retained the reflected electrons in the incoming annular beam for reflection back through the slit 18. It will be appreciated that the actual values for an optimum value range of the magnetic field strength will depend on the exact geometry of the selected microwave generator, including the width of the anode slit, as well as the energy of the electron beam.

TABLE

| | Simulated | Experimental |
|---|---|---|
| Annular Cathode Dia. (42) | 2.0 cm | 6 cm |
| Cathode-Anode Gap (54) | 7.2 mm | 1–4 cm (2.6 cm) |
| Anode Slit (46) | 0.6 mm | 0.48 cm |
| Anode Thickness (48) | 2.8 mm | 1.1 cm |
| Output Waveguide Dia. (52) | 6.0 cm | 18 cm |
| Beam Parameters | 3.8 MeV | 1.4–2.2 MeV |
| | 79.8 kA | 40–60 kA |
| | | t = 60 ns |

Figure 4:
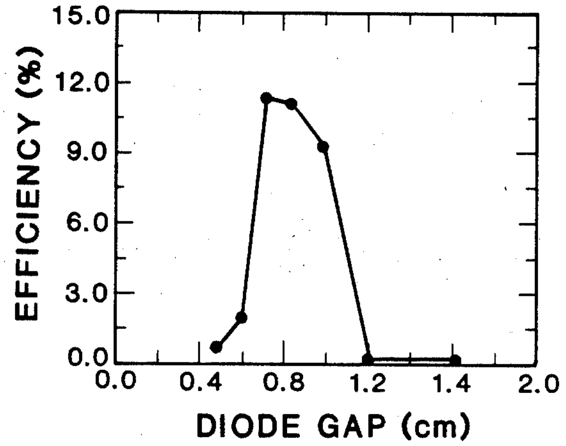
FIG. 4 is a graph of the simulated effect of the diode gap on efficiency performance of the generator shown in FIG. 2.

It was also found, as shown in FIG. 4, that an optimum value range for the cathode-anode gap 54 may be found at a given applied magnetic field. The diode gap affects the current of the electron beam generated by the diode. Since the self-magnetic field of the electron beam is proportional to the beam current, the total magnetic field (external applied field and self-magnetic field) has a dependence on the diode gap. The simulation results suggest that a combination of applied magnetic field and diode gap 54 might be found to further optimize efficiency.

Figure 5:
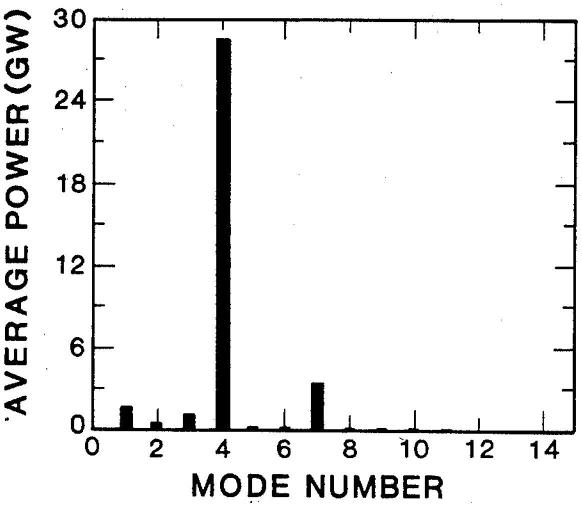
FIG. 5 is a graph showing a respective microwave mode distribution for the device shown in FIG. 2.

The simulation results also demonstrated that a microwave generator according to the present invention has improved single-mode characteristics. As shown in FIG. 5, the power output was concentrated substantially in mode $TM_{0.4}$. It should also be noted that the power output determined during the simulation is substantially higher than the power level in conventional virtual cathode microwave generators.

Figure 6A:
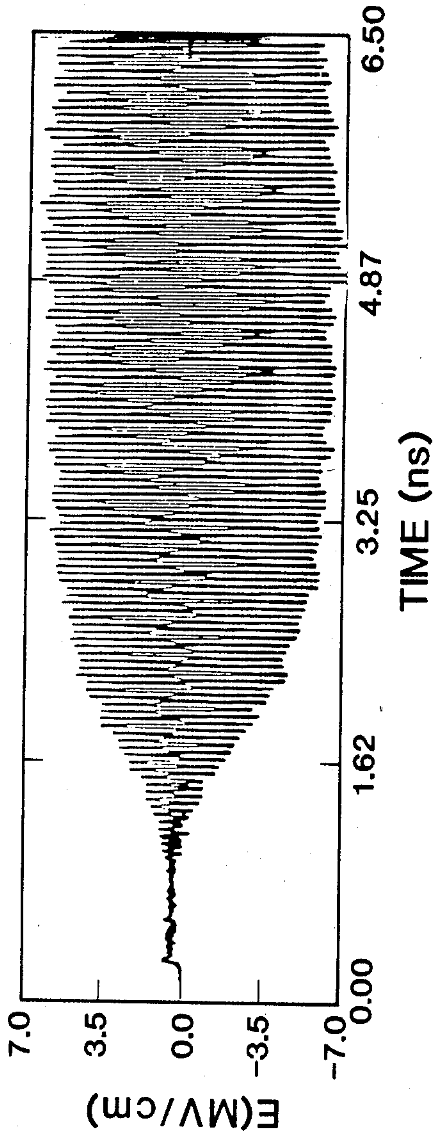
FIGS. 6A and 6B are a plot of the electric field amplitude versus time and a corresponding Fourier transform of the microwaves generated by the device shown in FIG. 2.
Figure 6B:
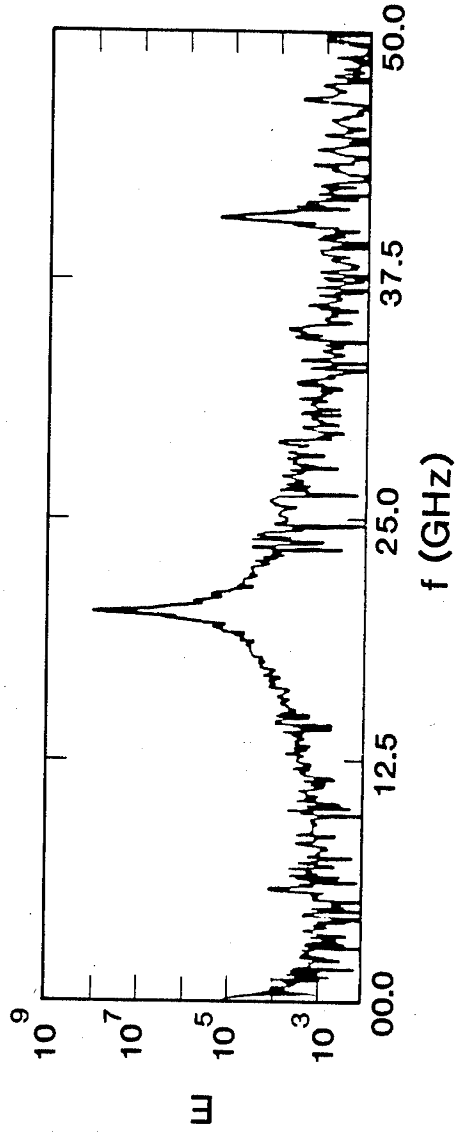

FIGS. 6A and 6B show yet another advantage of the present invention. FIG. 6A is a graph of output electric field versus time from the simulated microwave generator shown in FIG. 2. It is evident that a highly monochromatic output is obtained while still obtaining the single-mode characteristics shown in FIG. 5. The monochromaticity is further shown by FIG. 6B, a Fourier analysis of the graph shown in FIG. 6A. The amplitude logarithmic scale shows the dominant single frequency, along with a distinct harmonic frequency.

Figure 7:
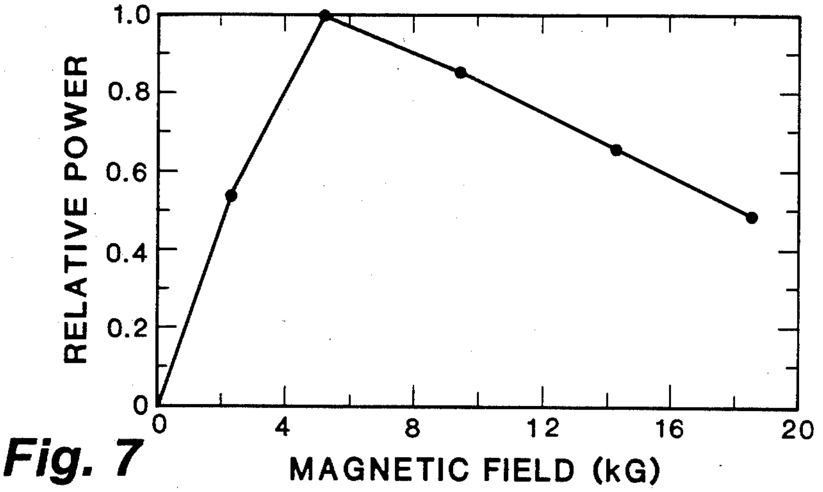
FIG. 7 is an experimental graph showing the effect on relative power of the axial magnetic field of the device shown in FIG. 2.

An experimental model was constructed having the experimental parameters set out in the Table above. The experimental configuration had dimensions which were substantially greater than the simulated dimensions, and incorporated a thick anode having an adequate range thickness with a circumferential slit corresponding to the annular electron beam. The experimental results confirm the predictions of the simulation. More particularly, as shown in FIG. 7, an optimum value range of magnetic field strength was shown to be required for maximum power output at a given anode-cathode gap of 2.6 cm.

Power measurements were also obtained for an applied magnetic field of 9.3 kG and an anode-cathode gap of 3.7 cm. Both the calculated and measured dominant waveguide mode was $TM_{0.2}$. An inferred peak power level of about 1.4±0.3 Gw was obtained at a dominant frequency of 3.9±0.4 GHz. A dominant output frequency of 3.6 GHz was calculated using the simulation technique herein discussed, showing good agreement with experimental results.

Thus, the present invention is directed to a microwave generator having a virtual cathode which overcomes the microwave generation problems associated with the reflexing of electrons in the diode region of the generator. An intense electron beam is formed in an annular configuration and injected through a slot in a range thick anode. An axial magnetic field is used to guide the electrons through the slotted anode. The injected beam current is above the space-charge limiting value, leading to the formation of a virtual cathode. The electric fields generated by the virtual cathode then act to reflect electrons and impart sufficient transverse momentum to the reflected electrons that a large fraction of them may diverge from the magnetic field lines and be intercepted by the thick anode. This eliminates the reflex microwave generation process and minimizes interpenetration of the incoming and reflected electron beams, which can severely degrade the quality of the incoming electron beam through two-stream instabilities.

The foregoing description of the preferred embodiment of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A microwave generator using an oscillating virtual cathode, comprising:

a cathode for emitting electrons;

an anode for accelerating emitted electrons from said cathode, said anode having an annular slit therethrough effective for forming said virtual cathode and having at least one range thickness relative to electrons reflected from said virtual cathode; and magnet means for producing a magnetic field having a field strength effective to form an annular beam from said emitted electrons in substantial alignment with said annular anode slit and to enable said electrons reflected from said virtual cathode to axially diverge from said annular beam;

wherein said reflected electrons returning toward said cathode diverge from said annular beam and are absorbed by said anode to substantially eliminate electrons reflexing between said cathode and said virtual cathode.

2. A microwave generator according to claim 1, wherein said anode is spaced from said cathode a distance effective to optimize microwave generation efficiency at said magnetic field strength.

3. A microwave generator according to claim 1, wherein said cathode is a field emission cathode.

4. A microwave generator according to claim 1, wherein said slit includes a thin conductive foil substantially transparent to said annular beam of electrons.

5. A method for generating coherent microwaves from an oscillating virtual cathode, comprising the steps of:

generating from a cold cathode a relativistic electron beam effective to form a virtual cathode;

confining said relativistic electron beam to an annular beam path having a predetermined radius by a magnetic field;

accelerating said beam toward an anode having a predetermined thickness and defining a circumferential slit at said predetermined radius for passage of said annular beam therethrough to form said virtual cathode;

said virtual cathode having a space charge developing repulsive forces effective to reflect electrons with a transverse energy for diverging from said axial magnetic field; and absorbing said reflecting electrons in said anode thickness.

* * * * *